(12) United States Patent
Streit

(10) Patent No.: US 9,142,656 B2
(45) Date of Patent: Sep. 22, 2015

(54) PHASE CONTROL THYRISTOR WITH IMPROVED PATTERN OF LOCAL EMITTER SHORTS DOTS

(71) Applicant: ABB Technology AG, Zurich (CH)

(72) Inventor: Peter Streit, Widen (CH)

(73) Assignee: ABB TECHNOLOGY AG, Zurich (CH)

( * ) Notice: Subject to any disclaimer, the term of this patent is extended or adjusted under 35 U.S.C. 154(b) by 78 days.

(21) Appl. No.: 13/720,106

(22) Filed: Dec. 19, 2012

(65) Prior Publication Data

US 2013/0105857 A1    May 2, 2013

Related U.S. Application Data

(63) Continuation of application No. PCT/EP2011/060329, filed on Jun. 21, 2011.

(30) Foreign Application Priority Data

Jun. 21, 2010   (EP) .................................. 10166682

(51) Int. Cl.
   *H01L 29/66*   (2006.01)
   *H01L 29/74*   (2006.01)
   (Continued)

(52) U.S. Cl.
   CPC ............ *H01L 29/74* (2013.01); *H01L 29/0839* (2013.01); *H01L 29/42308* (2013.01); *H01L 29/7428* (2013.01)

(58) Field of Classification Search
   CPC ....................................................... H01L 29/74
   USPC ........... 257/157, E27.052, E27.079, E29.036, 257/E29.037, E29.038
   See application file for complete search history.

(56) References Cited

U.S. PATENT DOCUMENTS

| 3,619,738 | A | | 11/1971 | Otsuka |
| 4,223,332 | A | * | 9/1980 | Sittig ............................ 257/166 |

(Continued)

FOREIGN PATENT DOCUMENTS

| DE | 19 54 665 A1 | 5/1971 |
| DE | 30 32 768 A1 | 4/1982 |

(Continued)

OTHER PUBLICATIONS

International Search Report (PCT/ISA/210) issued on Jul. 6, 2012, by the European Patent Office as the International Searching Authority for International Application No. PCT/EP2011/060329.

(Continued)

*Primary Examiner* — Jarrett Stark
*Assistant Examiner* — Mohammad M Hoque
(74) *Attorney, Agent, or Firm* — Buchanan Ingersoll & Rooney PC

(57) ABSTRACT

A phase control thyristor includes a main gate structure and a plurality of local emitter shorts dots arranged in a shorts pattern on a cathode side of the thyristor. The main gate structure includes longitudinal main gate beams extending from a center region of the cathode side towards a circumferential region. Neighboring main gate beams are arranged with a distance with respect to an associated intermediate middle line. The shorts pattern is more homogeneous in a region closer to a main gate beam than in a region closer to an associated middle line. Adaptions to match shorts patterns in neighboring segments of the cathode side surface are made in regions away from the main gate beams such that an electron hole plasma spreading from the main gate beam is not interfered by any inhomogeneity of the shorts dots pattern. The design rules enable an improvement of the thyristor operational characteristics.

23 Claims, 3 Drawing Sheets

(51) Int. Cl.
  *H01L 29/08*  (2006.01)
  *H01L 29/423*  (2006.01)

(56) References Cited

U.S. PATENT DOCUMENTS

| | | | |
|---|---|---|---|
| 4,595,939 A * | 6/1986 | Yamaguchi et al. | 257/115 |
| 4,605,451 A * | 8/1986 | Garrett | 438/133 |
| 4,641,175 A * | 2/1987 | Shiraishi | 257/128 |
| 4,903,105 A | 2/1990 | Najji | |
| 5,146,305 A * | 9/1992 | Bernier | 257/149 |
| 6,407,901 B1 * | 6/2002 | Casey et al. | 361/119 |

FOREIGN PATENT DOCUMENTS

| | | | |
|---|---|---|---|
| GB | 1 546 094 A | | 5/1979 |
| JP | 51136290 A | * | 11/1976 |
| JP | 57-004159 A | | 1/1982 |
| JP | 358222571 A | * | 12/1998 |

OTHER PUBLICATIONS

European Search Report for EP 10166682.4 dated Jun. 22, 2011.
J. Webster, "Encyclopedia of Electrical and Electronics Engineering", Dec. 31, 1999, pp. 213-219, John Wiley & Sons, XP002640685.

* cited by examiner

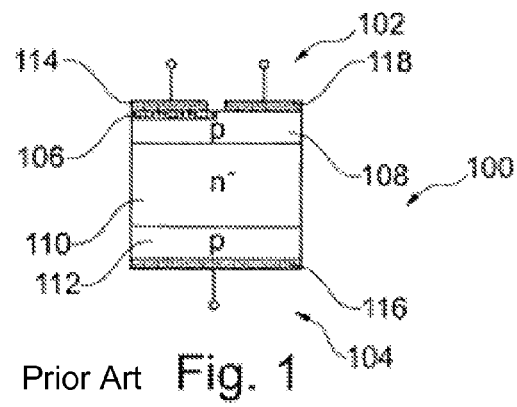
Prior Art Fig. 1
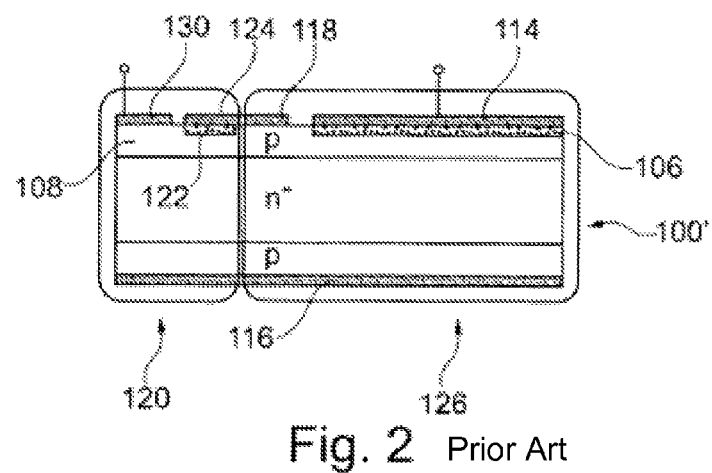
Fig. 2 Prior Art
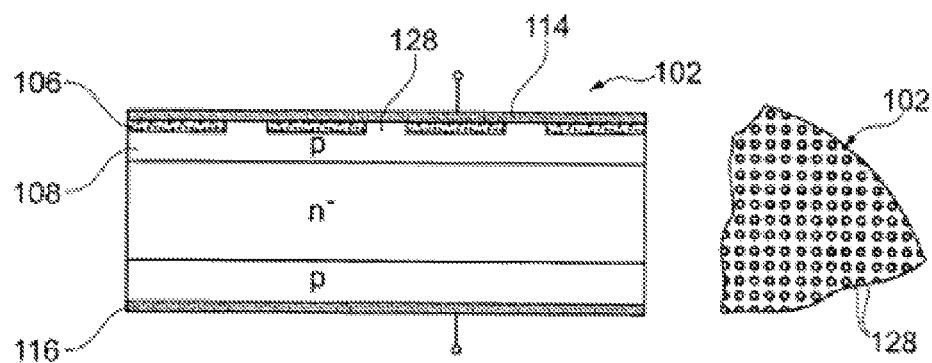 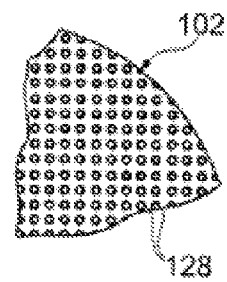
Fig. 3
Prior Art
Fig. 4
Prior Art

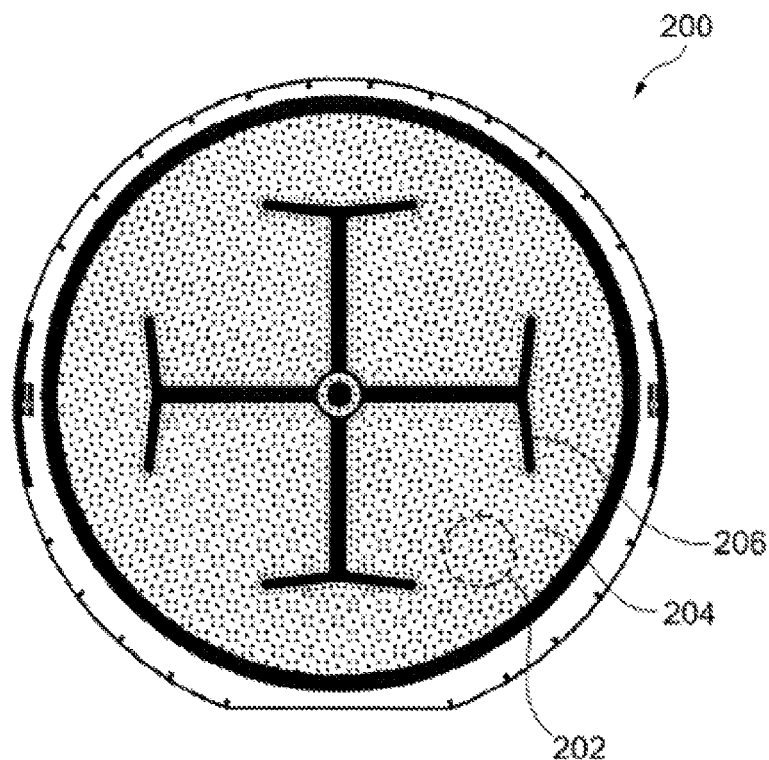
Prior Art  Fig. 5
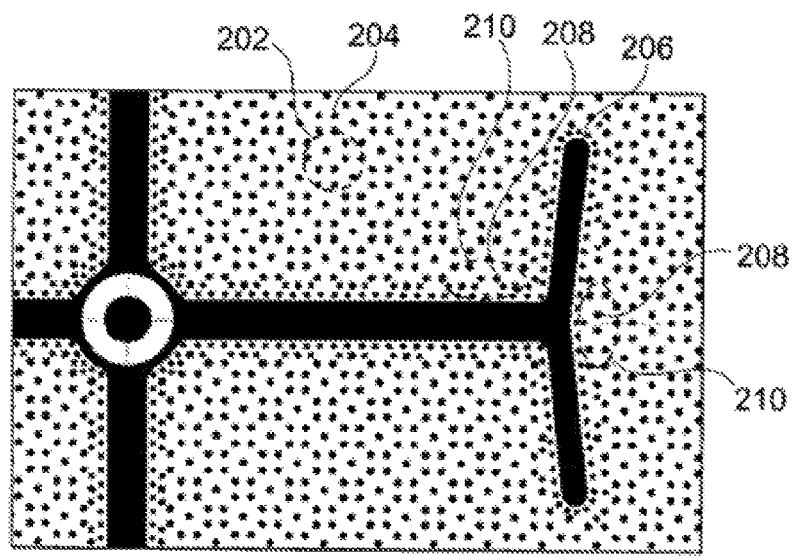
Prior Art  Fig. 6

PHASE CONTROL THYRISTOR WITH IMPROVED PATTERN OF LOCAL EMITTER SHORTS DOTS

RELATED APPLICATIONS

This application claims priority as a continuation application under 35 U.S.C. §120 to PCT/EP2011/060329, which was filed as an International Application on Jun. 21, 2011 designating the U.S., and which claims priority to European Application 10166682.4 filed in Europe on Jun. 21, 2010. The entire contents of these applications are hereby incorporated by reference in their entireties.

FIELD

The present disclosure relates to a phase control thyristor having a main gate structure as well as a plurality of local emitter shorts dots arranged on a cathode side of the thyristor.

BACKGROUND INFORMATION

A thyristor, which is sometimes also referred to as silicon controlled rectifier (SCR), is a switching device which can be turned on when forward biased by a turn-on voltage and when a positive gate current is supplied to a gate terminal. The thyristor is then said to be in a forward conducting state in which a current may flow from an anode to a cathode. On the other hand, the thyristor can also be in a forward blocking state meaning that a high positive voltage can be blocked. In a reverse direction, the thyristor cannot be turned on. A thyristor design may be reverse blocking, which means that it can block approximately the same voltage in the reverse direction as in the forward off-state, or asymmetric, which means that it has virtually no blocking capability in the reverse direction. Since phase control applications commonly require reverse blocking capabilities, a phase control thyristor (PCT) is generally reverse blocking.

For high power applications, thyristors have been developed based on round semiconductor wafers having a diameter of, for example, 4 or 5 inches. However, advanced thyristor applications utilize even larger thyristor designs based, for example, on 6 inch wafers. It has been observed that for such large thyristor designs, it may not be sufficient to simply scale-up previous smaller thyristor designs. With an increasing thyristor diameter, further effects may gain influence on the thyristor operation. For example, a larger thyristor for higher nominal current with equivalent forward blocking capacity or turn-on characteristics as well as cooling characteristics during thyristor operation may not be achieved by proportionally scaling the thyristor dimensions.

DE 1 954 665 discloses a rectifier having a star shaped main gate structure. In between two stripes of the main gate structure, emitter shorts are arranged in the form of a fir tree. There are no emitter shorts arranged in a region close to the main gate structure. Such a fir tree structure gives a coarse structure, which cannot be used for larger devices because the distribution of the branches is too coarse to efficiently influence the blocking capacity and the turn-on characteristics in a way necessary for larger devices.

U.S. Pat. No. 4,903,105 discloses a triac including two thyristors. On the border between these thyristors, a maximum of two emitter short stripes are arranged. The stripes may be formed as a chopped stripe, which have at least 30% of the stripe p doped, that is, the areas between the p doped regions may have a length of less than 70% of the repetition length of the p/n areas of the stripes. The arrangement of these emitter shorts between the thyristors is needed to separate the thyrisors from each other. This is a necessity for the operation of the triac.

SUMMARY

An exemplary embodiment of the present disclosure provides a phase control thyristor which includes a main gate structure on a cathode side of the thyristor, and a plurality of local emitter shorts dots arranged in a shorts pattern on the cathode side of the thyristor. The main gate structure includes longitudinal main gate beams extending from a center region of a surface of the cathode side towards a circumferential region. Neighboring main gate beams are arranged with a distance with respect to an associated intermediate middle line. The shorts pattern is more homogeneous in a region closer to a main gate beam than in a region closer to an associated middle line.

BRIEF DESCRIPTION OF THE DRAWINGS

Exemplary embodiments of the disclosure will be explained in more detail in the following text with reference to the attached drawings. The described embodiments are meant as examples only and shall not limit the present disclosure. The drawings are only shown schematically and are not to scale. Generally, alike or similarly functioning parts are given the same reference symbols.

FIG. 1 shows a cross-sectional view of doping regions and contact arrangements of a phase controlled thyristor.

FIG. 2 shows a cross-sectional view of a phase controlled thyristor with an amplifying gate structure.

FIG. 3 shows a cross-sectional view of a portion of a phase controlled thyristor with cathode emitter shorts.

FIG. 4 shows a top view onto a shorts dots pattern of the phase controlled thyristor of FIG. 3.

FIG. 5 shows an $n^+$-mask for defining phosphorous-doped regions (white areas) at a cathode side surface of a phase controlled thyristor with a conventional design.

FIG. 6 shows an enlarged view of portions of the mask shown in FIG. 5.

DETAILED DESCRIPTION

Figure 7:
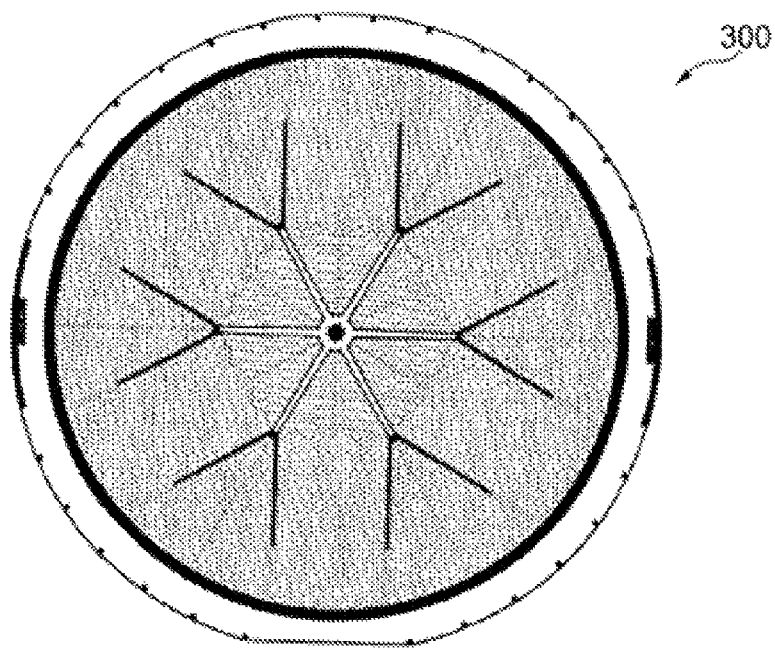
FIG. 7 shows an $n^+$-mask for defining phosphorous-doped regions (white areas) at a cathode side surface of a phase controlled thyristor in accordance with an exemplary embodiment of the present disclosure.

Exemplary embodiments of the present disclosure provide a phase control thyristor with a design enabling advantageous thyristor operation characteristics even with enlarged thyristor diameters.

According to an exemplary embodiment of the present disclosure, a phase control thyristor includes a main gate structure on a cathode side of the thyristor, and a plurality of local emitter shorts dots arranged in a shorts pattern on the cathode side of the thyristor. Therein, the main gate structure includes longitudinal main gate beams extending from a center region of the cathode side surface towards a circumferential region. Neighboring main gate beams are arranged with a distance with respect to an associated intermediate middle line. Therein, the shorts pattern is more homogeneous in a region closer to a main gate beam than in a region closer to an associated middle line.

Exemplary embodiments of the present disclosure may be seen as being based on the following feature. As explained in further detail below, operation characteristics of a thyristor may depend on a multiplicity of parameters. One of such parameters influencing, for example, the blocking capability and/or the turn-on characteristics of the thyristor may be the design or arrangement of a main gate structure as well as of a spatial distribution of dot-shaped local emitter shorts at the cathode side of the thyristor.

According to an exemplary embodiment of the present disclosure, the main gate structure may significantly influence the formation of an electron-hole plasma during turn-on of the thyristor. Plasma formation may start at the main gate structure and may spread laterally throughout the entire cathode side surface.

On the other hand, in accordance with an exemplary embodiment, a plurality of local emitter shorts may be provided in the form of dots arranged throughout the remaining cathode side surface. The design of the shorts dot pattern may influence the forward blocking capacity both statically and dynamically as well as turn-on characteristics.

As the design of the main gate structure and the design of the shorts dots pattern may influence the thyristor operation characteristics in different ways, an improved design or layout of the cathode side of a thyristor may have to take into account a trade-off between such various influences. It has been found that advantageous thyristor characteristics may be realized by using a shorts pattern that is more homogeneous in a region closer to a main gate beam than in a region closer to an associated middle line between neighboring main gate beams. In other words, the homogeneity of the dots pattern may be higher in regions close to a main gate beam than in regions further away from the main gate beam.

"Homogeneity" of the shorts pattern may mean that the dots forming the emitter shorts within one surface region of the thyristor cathode side have a more or less constant size and/or spacing. In other words, "homogeneous" may mean that the size of shorts dots and the distance between neighboring shorts dots is substantially the same throughout a surface region. This may also mean that a density of shorts dots is substantially constant. "Less homogeneous" may then mean that at least one of the size of dots or spacings between adjacent shorts dots may significantly vary throughout a surface region. The density of the emitter short dots may be expressed as a number of dots per surface area or as a surface size of the dots per surface area. "Surface" shall be that side of the dots toward the cathode metallization, for example, it is arranged in the cathode side plane.

In other words, it has been found to be advantageous that sizes of shorts dots and spacings between adjacent shorts dots are substantially constant within a region close to a main gate beam whereas such spacings may vary more in a region further away from the main gate beam, for example, closer to an associated middle axis between neighboring main gate beams.

Similarly, sizes of the shorts dots may be substantially constant within a region closer to the main gate beam, whereas in a region closer to an associated middle line, the sizes of the shorts dots may vary more.

This finding has been developed from the following understanding. In designing the cathode side of a thyristor including the main gate structure and the shorts pattern, it has been observed that it may commonly not be avoided that emitter shorts dots are arranged with a certain inhomogeneity in the shorts pattern. This may be due to the fact that the design of the main gate structure should be close to optimum in order to optimize specific thyristor operation characteristics, while at the same time such main gate structure design may also influence the design of an optimum shorts pattern. Thus, as the emitter shorts dots may not be provided with a homogeneous shorts pattern throughout the entire cathode side surface, it may be necessary to accept some pattern inhomogeneity somewhere on the cathode side surface. It has been observed that such pattern inhomogeneity may be less detrimental to thyristor operation characteristics in case it is arranged as far away from the main gate structure as possible. In other words, while pattern inhomogeneities should be prevented in a region close to the main gate structure, it may be accepted in farther regions such as in regions close to an associated middle line between neighboring main gate beams.

For example, shorts dots in the region closer to the main gate beam may have larger spacings than shorts dots in the region closer to the associated middle line. For example, in the region closer to the main gate beam, the spacings and sizes of the shorts dots may be selected such that the shorts dots pattern is close to optimum and the shorts dots density is close to an optimum low value. Such low density of shorts dots, for example, at least one of small dots or large spacings, may improve, for example, plasma spreading initiated from the main gate structure towards the remaining cathode side surface. On the other hand, far away from the main gate structure, the shorts pattern may vary as such pattern inhomogeneity may be less harmful in such distant regions. As the shorts dots density should not fall below a specific optimum value, additional shorts dots may be arranged within such distant region in order to "smoothen" a transition from one region close to a first main gate beam to an adjacent second region close to a second neighboring main gate beam. Increased shorts dots density may then mean at least one of reduced spacings or increased sizes of the shorts dots.

The presence of shorts hinder unwanted triggering of the thyristor when high dv/dt are applied. They also hinder plasma spread, when the thyristor is turned on by applying a gate pulse. Due to the fact that the shorts are placed homogenous, plasma spreads homogeneously. The only inhomogenities in the short pattern are along symmetry lines (associated middle lines), between the amplifying main gate beams, where plasma spread stops, because it reaches the symmetry line from opposite positions. Thus, it is advantageous to place the inhomogeneities in the short pattern close to the associated middle lines.

It may be advantageous that the neighboring main gate beams are arranged symmetrically with respect to the respective associated intermediate middle line. In other words, the middle line may be a line of symmetry for the design of two neighboring main gate beams. For example, an even number of main gate beams may extend from the central region to the circumference of the cathode side surface in the form of a star or a snowflake. The symmetry may simplify the design of the cathode side surface. The lines of symmetry may be a maximum distance away from the associated main gate beams such that in the region of such symmetry lines, in homogeneities of the shorts pattern may be accepted. Of course, an uneven number of main gate beams is also possible.

According to another feature of the present disclosure, the main gate beams may be tapered. Therein, a beam width may reduce from the center region towards the circumferential region of the cathode side surface. Thus, the local width of the main gate beams may be adapted to a local current density during regular thyristor operation. In other words, a metallization of the main gate beams may be designed such that the current density is substantially kept constant throughout such metallization. Since turn-on current may be constant per turn-on line length. This may lead to regularly tapered beams, for example, the beam width continuously reduces from the center region towards the circumferential region. Thereby, space may be saved and a main thyristor emitter area may be optimized.

It may be noted that this feature of tapered main gate beams may also be realized independently of the above mentioned feature of the specifically adapted shorts pattern. However, the proposed specifically adapted shorts pattern according to exemplary embodiments of the present disclosure may allow for an increased freedom of the turn-on line geometry such that an advantageous adaption of the geometry of the main gate beams may be easily obtainable.

According to another feature of the present disclosure, the phase control thyristor includes a pilot thyristor on the cathode side, and the pilot thyristor includes a pilot gate structure. This pilot gate structure includes longitudinal pilot gate beams extending into a region of the main gate beams. Since the emitter layer of the pilot may extend into the broad part of the main gate beams, electron hole plasma from the pilot thyristor may extend into the main gate beams possibly preventing overload in certain cases.

First, some basic principles of phase controlled thyristors (PCT) and definitions of terms and wordings subsequently used herein will be given with respect to FIGS. 1-4.

FIG. 1 schematically shows a cross-section of a simple thyristor 100. The thyristor includes four layers of semiconducting material having alternating conduction types, for example, an npnp-layer-stack structure. As used herein, an n-type conductivity may be referred to as a first type of conductivity, while a p-type conductivity may be referred to as a second type of conductivity, which is different from the first conductivity type. In an order from a cathode side 102 to an anode side 104 of the thyristor 100, the thyristor first includes an $n^+$-doped cathode emitter layer 106. Then, a p-doped base layer 108 and an $n^-$-doped base layer 110 follow. Finally, at the anode side 104, a p-doped anode layer 112 is arranged. The $n^+$-cathode emitter layer 106 is contacted by a cathode metallization 114. The p-anode layer 112 is contacted by an anode metallization 116. The p-base layer 106 is contacted by a gate metallization 118.

When a positive voltage is applied between the anode metallization 116 and the cathode metallization 114, the thyristor 100 may be switched between a blocking state (off state) and a conducting state (on state). As long as no current is supplied to the gate metallization 118, the thyristor will remain in the blocking state. However, when the thyristor is triggered by supplying a current to the gate 118, electrons will be injected from the cathode, flow to the anode where they will lead to hole injection, and an electron-hole plasma will form in the p-base layer 108 and n-base layer 110 which may switch the thyristor to the conducting state. The conducting state may be maintained as long as the forward voltage is applied and will only be stopped when the voltage applied between the anode metallization 116 and the cathode metallization 114 is switched off or even reversed. Upon applying a reversed, negative voltage between the anode and the cathode, the thyristor goes in its blocking state (off state) and may only be switched to the conducting state (on state) by re-triggering by again applying a gate current. However, in order to obtain its full blocking capability, the reverse voltage has to be applied for a certain duration called quiescence time $t_q$ such that the previously injected electron-hole plasma may disappear due to recombination processes thereby enabling the blocking capacity of the device.

To trigger a thyristor 100 as shown in FIG. 1, a substantial gate current would be required. An easy improvement may include the integration of an auxiliary thyristor, which are well-known to experts, between a main gate and an anode of a thyristor 100' as depicted in FIG. 2. The auxiliary thyristor may alternatively be called a pilot thyristor or an amplifying gate structure. Therein, the auxiliary gate 130 contacts the p-base 108 in a region of the auxiliary thyristor 120. The auxiliary thyristor 120 also includes a further $n^+$-emitter layer 122. This further $n^+$-emitter layer 122 is contacted by a further cathode metallization 124 of the auxiliary thyristor. The further cathode metallization 124 of the auxiliary thyristor is internally connected to the main gate metallization 118 which contacts the underlying p-base layer 108 in the region of the main thyristor 126. An $n^+$-emitter layer 106 included in the main thyristor region 126 is contacted by the cathode metallization 114 of the main thyristor. The further cathode metallization 124 of the auxiliary thyristor 120 may not be accessible from the outside of the thyristor 100'.

In accordance with an exemplary embodiment, the pilot thyristor structure is integrated between central gate and main thyristor. At the central gate, the pilot thyristor has a further n+-emitter layer 122 and towards the main thyristor a p+-emitter layer. These layers are connected to each other via a metallization. The p+-emitter layer acts as a short on the border for the further n+-emitter layer 122. The current in the further n+-emitter layer 122 is converted via the metallization to a hole current, which again acts as an injection current for the main thyristor. The p+-doped emitter layer carries the hole current, which injects the opposite section of the main thyristor. A circumferential p+-emitter layer is sufficient for this purpose. The charge spreading is achieved via the metallization. Furthermore, there may be shorts present in the further n+-emitter layer 122.

Whereas a high gate overdrive factor, for example, a ratio of utilized gate current and minimum gate trigger current, may speed up triggering of the thyristor 100', a further improvement may substantially help this process. As may be seen from FIG. 2, the triggered state of the main thyristor 126, for example, the injected electron-hole plasma, starts at a boundary of the auxiliary thyristor 120 which might be a ring of about 1 cm diameter at a center of the thyristor 100'. The plasma then has to spread out to the whole thyristor area which may take several milliseconds. Only after this will the thyristor exhibit its steady on state forward voltage characteristic. To shorten the maximum distance to the area elements of the thyristor device, a distributed amplifying gate structure as shown in FIG. 5 and as described in more detail further below may be used. This means that a gate doping of the main thyristor may have a more complex structure such as shown according to an exemplary embodiment in FIG. 5 and may include, for example, a T-gate design commonly used for large area PCTs. Such T-gate design may substantially shorten the distance for plasma spread so that the thyristor may be fully turned on by about 1 ms after the gate triggering pulse. Since plasma spread may be related to the time during which there is already substantially forward current and still high blocking voltage, this turn-on duration may have a strong influence on the turn-on energy loss.

A thyristor 100' with a homogeneously doped $n^+$-cathode emitter layer 106 as shown in FIG. 2 may be very sensitive to transients with positive voltage variations dv/dt. Without impeding the forward characteristic significantly, this disadvantage may be mitigated when small regions of an $n^+$-emitter layer are left out in the cathode emitter layer 106 and the corresponding p-doped base layer 108 may reach the cathode side surface 102 metalized with the cathode metallization 114 as shown in FIG. 3. The p-doped regions with missing $n^+$-doping on the cathode side 102 may be referred to as cathode emitter shorts 128 as they may short-circuit the cathode junction. The emitter shorts 128 may form an ohmic short-circuit across the p-base-emitter junction and may conduct a significant portion of the current at low current densities, for example, in all phases where forward blocking is required. Therefore, an undesired dv/dt triggering may be avoided in most practical cases.

As shown in the top view of FIG. 4, the emitter shorts 128 may be provided in the form of small dots arranged in a regular pattern across the whole cathode side surface 102. The shorts 128 not only influence the axial triggering behavior, but a good shorts design may also yield a high lateral plasma spread velocity and may therefore result in a high permissible current variation di/dt. It may be of high importance that there is no location with in which the shorts density gets below a minimum value because this location may form a weak spot during re-application of forward blocking voltage after turn-off.

Exemplary diameters of the dots, for example, the largest extension of the dot on the surface, may be between 30 μm up to 500 μm, such as between 50 to 400 μm (e.g., between 100 to 400 μm). The surface area of the dots may be 2.5% to 20%.of the total surface area in the region of the cathode emitter layer alternating with the emitter short dots. That means that between 12 short emitter dots/cm$^2$ up to 30000 dots/cm$^2$ are placed on the cathode side. In accordance with an exemplary embodiment, if the dots are small, more dots will be present than if the dots have a large diameter.

In accordance with an exemplary embodiment, in the area closer to the neighboring main gate beam the dots will cover an area of 2.5% up to 8% of the total area, whereas in the area closer to the associated intermediate middle line the density will be up to 20%, for example, between 8 and 20% or even between 10 to 20%.

In case the density is lower closer to the main gate beam, the number of dots may be between 12 to 10000/cm$^2$, for example, at least 100/cm$^2$ up to 3500/cm$^2$.

In case the density is higher closer to the associated middle line, the number of dots may vary between 40 to 30000, for example, at least 200/cm$^2$.

Accordingly, it is evident that a design of the doping structure on the surface of the cathode side 102 including the amplifying gate structure as explained above with respect to FIG. 2 as well as including the shorts pattern as explained above with respect to FIGS. 3 and 4 has to be optimized in order to obtain satisfying operational characteristics of the thyristor with respect to, for example, forward blocking capability, triggering velocity, quiescence time and transient characteristics such as dv/dt stability.

Figure 8:
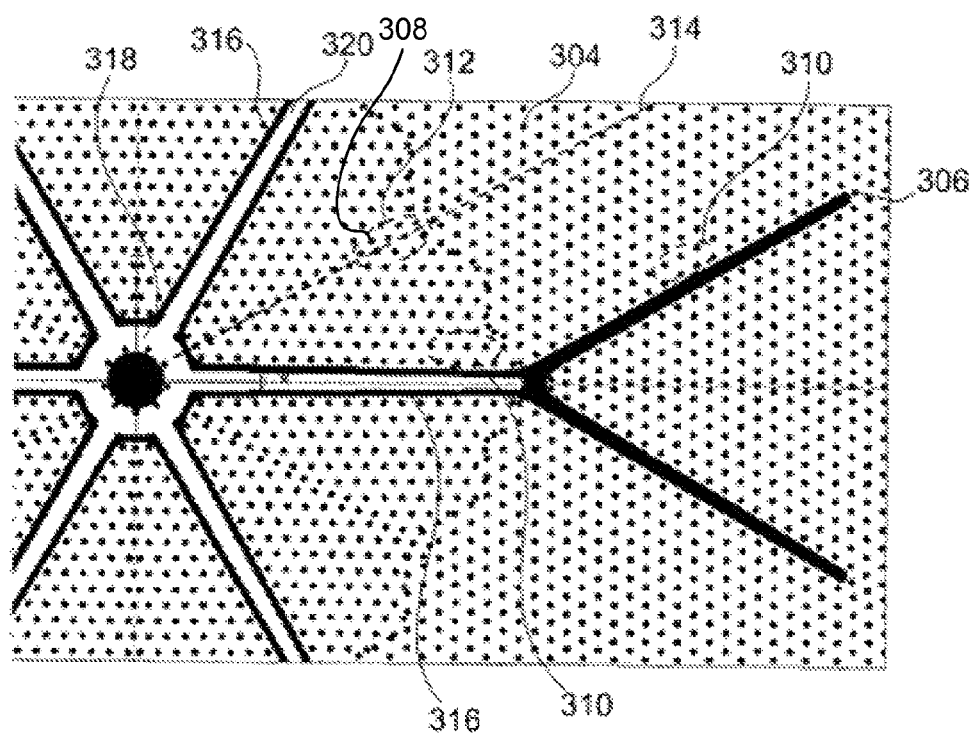
FIG. 8 shows an enlarged view of portions of the mask shown in FIG. 7 according to an exemplary embodiment of the present disclosure.

In the following, exemplary embodiments of the present disclosure will be described with reference to FIGS. 5-8. These drawings show diffusion mask patterns which may be used to define the n$^+$-type emitter regions 106 at the surface of the cathode side 102 of the thyristor 100. In the drawings, the white regions indicate areas which may be doped with phosphorous in order to obtain the n$^+$-type doped emitter layer 106, and the dark regions prevent phosphorus deposition. FIGS. 5 and 6 show a known mask design. FIGS. 7 and 8 show a mask design for a thyristor according to an exemplary embodiment of the present disclosure. Before discussing details of the disclosure by comparing structures of the known design with the design according to an exemplary embodiment of the present disclosure, some considerations underlying such inventive details will be discussed.

The following disclosure mainly describes a number of qualitative improvements in designing the mask set for very large PCT designs. It mainly addresses a lateral structure on the gated side of the thyristor and not any questions regarding starting silicon wafer design, diffusions, wafer edge contouring (e.g., beveling) or passivation. The designs according to the present disclosure are especially useful for large thyristors with amplifying gate structures, independent of the voltage class or device application. A further goal may be to obtain a good di/dt performance and low turn-on energy as well as a favorable relation between on-state voltage and peak current, on the one side, and reverse recovery charge respectively circuit commutated recovery time, for example, quiecence time $t_q$, at the other side.

In order to obtain full blocking capacity of a thyristor, the entire leakage current of the pnp-structure should be conducted on the cathode side (e.g., hole current) at sufficiently low ohmic resistance through the p-contact areas of the p base layer 108 to the cathode metallization 114 such that no electrons are injected. For this purpose, a high minimum density of emitter shorts 128 may be desired.

The turn-on process requires lateral spreading of the electron-hole plasma. Therefore, a suitable n$^+$-emitter layer design has to be found in order to inject electrons thereby generating a plasma front which spreads laterally along the n$^+$-emitter layer such that, finally, the entire surface of the connected main cathode emitter is switched to the conducting state. This process of plasma spreading may be disturbed by the emitter shorts 128. Furthermore, the area of the emitter shorts 128 may not contribute to the conducting process. Thus, in order to optimize the turn-on process, a small density of emitter shorts 128 may be advantageous.

The turn-on process may also depend on the length and the structural design of the initially triggered contour. Therefore, particularly for very large thyristor areas, this "turn-on line" should also be enlarged. However, for this purpose, a stronger triggering pulse may be required. Such pulse may not be provided by an external triggering device or "gate unit" directly. Therefore, large thyristors generally include an internal triggering amplification. This may be achieved by at least one pilot thyristor. The gate unit triggers the pilot thyristor, and the pilot thyristor then triggers the main thyristor. Thus, on the cathode side, three metal electrodes may be provided: (i) a central gate contact which may be round and which may be connected to the gate unit via a thin wire; (ii) a cathode of the pilot thyristor in which the cathode is connected to the gate fingers (extensions) of the extended gate structure 306 and is electrically floating; and (iii) the main cathode which may be contacted by pressing a molybdenum disk thereon. A separation of the extended gate structure and the cathode side molybdenum disk may be obtained by providing the metallization of the main cathode with a larger thickness, thereby preventing contact of the molybdenum disk with the extended gate structure. However, for the central gate contact, an opening in the molybdenum disk may be required.

In the conducting state, the entire area below the main cathode metallization 114 of the thyristor is flooded with charge carriers of both polarities, for example, electrons and holes, forming a plasma. The phase control thyristor may be turned off passively by commutating of the current. As soon as the current changed its direction injection stops on both sides and the plasma collapses approximately exponentially by recombination. The rate of recombination may be determined by influencing the carrier lifetime, for example, by irradiating the finished wafer. In case the voltage between the main electrodes is commutated again during this collapsing of the plasma, an increased leakage current may flow which may lead to an automatic re-triggering. Only after characteristic time $t_q$, also referred to as quiescence time, a re-triggering may be prevented and the thyristor obtains its complete blocking capacity. This quiescence time may depend on the density of the previous plasma, the recombination rate and the efficiency of the bulk shorts distribution. Any local defect of the bulk shorts distribution may result in a local reduction of the threshold for re-triggering and may therefore result in an increased quiescence time.

However, also without any preceding current in forward direction, a fast increase of the blocking voltage may result in an axial displacement current due to a capacity of the space charge region of the thyristor. This may result in erroneous triggering and should be prevented by a sufficient dv/dt stability. In contrast to the case of turning-off, this capacity current flows homogeneously from the entire area, for example, from the gate, the pilot and the triggering structure. Thus, the dv/dt stability may also limit the admissible triggering sensitivity of the "turn-on line" and requires a specific density of the shorts pattern at the border of the main thyristor (and of the pilot thyristor at an inner side).

Accordingly, designing large area thyristors must balance different influences:

(i) The forward voltage drop requires a low density shorts pattern and long carrier lifetimes, whereas the quiescence time requires a specific minimum shorts pattern density and carrier lifetime limits.

(ii) The turn-on process requires a low density shorts pattern and long turn-on lines, while the forward voltage drop requires maximum area use and thus low area losses for the triggering structure.

(iii) The turn-on process requires a high triggering sensitivity of the turn-on line, while the dv/dt stability requires a restriction of this sensitivity.

(iv) A long turn-on line being not very sensitive for triggering requires a large pilot thyristor which then, however, means large area losses being negative for the forward conducting state. Furthermore, cooling of the central region of the thyristor may be difficult as such cooling may be realized by pressing the molybdenum disk onto the surface of the main thyristor in thermal contact.

FIGS. 5 and 6 show a known design of a mask 200 for defining the n-emitter layer as it for a known thyristor having a diameter of 4 inches. In known design approaches, a shorts pattern in a bulk region (subsequently referred to as bulk shorts pattern 202) has been designed and optimized first. Therein, the bulk shorts pattern was designed substantially homogeneously throughout the entire thyristor surface. In this bulk shorts pattern, the size of shorts dots 204 and the spacings between neighboring shorts dots 204 was substantially constant. After designing such homogeneous shorts dots pattern, the extended gate structure 206 had to be incorporated into the design. Thus, the bulk shorts pattern 202 had to be adapted in a region in proximity to the gate structure 206. As can be clearly seen in the enlarged view of FIG. 6, additional shorts dots 208 have been incorporated along a border of the gate structure 206 in a region 210 close to the gate structure 206.

However, such adaption of the shorts pattern in a region close to the gate structure may result in a negative influence to the thyristor operation characteristics. First, such region 210 is also responsible for the adaption of the quiescence time $t_q$ and the dv/dt stability. Second, this region 210 has to be crossed by the plasma front during turning-on of the thyristor. Taking into account that the efficiency of the shorts with respect to the quiescence time and the dv/dt stability is determined by the weakest point, it is evident that any adaption of the shorts pattern has to be performed conservatively, for example, it may result in a locally over-dimensioned shorts density. However, during turning-on, the plasma front has to overcome such extra barrier resulting from large shorts density. Furthermore, the complexity of the shorts pattern geometry may even increase in case of a more complex geometry of the turn-on line.

Thus, it has been an idea underlying the present disclosure to decouple any adaption of the shorts pattern from the geometry of the turn-on line in the neighborhood of the gate structure. In other words, the distribution structure and the geometry of the turn-on line may be relieved from any restraints due to matching it with the bulk shortening pattern. This may be achieved by a different and new orientation of the bulk shortening pattern and a new placement of any inevitable matching zones into areas not being very sensitive to plasma spreading.

Accordingly, as shown in FIGS. 7 and 8, a new shorts pattern is provided. In the design of the mask 300 according to the present disclosure, the shorts pattern is more homogeneous in regions 310 closer to a main gate structure 306 than in regions 312 closer to an associated middle line 314, which is a symmetry line between neighboring main gate beams 316 forming portions of the main gate structure 306. Thus, while the shorts pattern is substantially homogeneous in the neighborhood of the main gate beam, additional shorts dots 308 may be introduced in the region 312 close to the middle line 314, thereby resulting in a denser shorts dots pattern in this region. In this case, the density of the emitter short dots is smaller in a region closer to a main gate beam and larger in a region closer to an associated middle line 314.

Alternatively, the shorts pattern is substantially homogeneous in the neighborhood of the main gate beam and less shorts dots 308 are present in the region 312 close to the middle line 314, thereby resulting in a lower shorts dots pattern in this region. With both alternatives, it is ensured that the distribution of short dots is more uniform close to the main gate beam than far away from the main gate beams (e.g., on the associated intermediate middle line).

Thus, the shorts pattern of the main thyristor area is not necessarily a continuous pattern all around the distributing gate. However, the shorts pattern along all parts of the turn-on line is absolutely regular leading to an even turn-on along the whole contour of the turn-on structure. Adaptions of the shorts pattern are decoupled from the turn-on line and are moved into regions far away from the gate beams which regions do not have to be crossed by the plasma front. In other words, the regions where the different segments of the main thyristor areas meet and have to be matched may be either symmetry regions where two plasma fronts meet or they are orthogonal to plasma spreading such that they, therefore, are of little influence for the plasma spreading process and mainly irrelevant to di/dt capability.

With the new design rules, no or only minor inhomogeneities in the shorts pattern resulting from differences in shorts dots size or spacings between neighbouring shorts dots are realized in the neighbourhood of the main gate structure. Only in corners or at ends of the main gate structure, some minor adaption may be required.

With this simple design rule for adapting the shorts pattern, the gate structure 306 may be designed with tapered main beams 316 having a beam width reducing from the center region towards the circumferential region of the cathode side surface or the mask 300, respectively. Using such tapered beams 316, the current density in the metallization of the beams may be kept constant. Since turn-on current may be constant per turn-on line length, this may lead to regularly tapered beams that are saving space and may optimize the main thyristor emitter area. It may be noted that tapered main beams may also result in an advantageous distribution of the current density for a case of a conventional shorts patterns, for example, where the shorts pattern has not been adapted as described above.

In accordance with an exemplary embodiment, the thyristor design of the present disclosure may also include a pilot thyristor on the cathode side, wherein the pilot thyristor includes a pilot gate structure 318 including longitudinal pilot gate beams extending into a region of the main gate beams 316. In other words, the pilot emitter extensions 320 of the pilot thyristor (which, in FIGS. 7 and 8 is represented by the wide areas of the central and beam structure) extends into the broad part of the main gate beams 316 allowing the plasma of the pilot thyristor to extend into the beams at high pilot thyristor currents preventing overload in certain cases. Furthermore, this design may eliminate the broadest parts of the masked cathode emitter layer, leading to a more homogeneous point defect gettering of the whole thyristor area during processing.

Summarized in a slightly different wording, the present disclosure provides a lateral structure of large area thyristors with an extended distribution of the main thyristor turn-on line for good dI/dt performance. First, the distribution structure and the geometry of the turn-on line may be relieved from any restraints due to matching it with the area shorting pattern. This may be achieved by a different and new orientation of the area shorting and a new placement of the inevitable matching zones into parts irrelevant for plasma spreading. The new freedom of turn-on line geometry may be used to match the width of the secondary gate beams with the local turn-on current they have to carry, leading to conical instead of the usual equal-width design. This may reduce the total area used for the beams (and lost in main thyristor area) considerably for a given length of turn-on line, leading to a more efficient use of silicon area. Then, the broadest parts of the distribution beams adjacent to the central gate structure may be used to extend the pilot cathode emitter into the beams. This not only enables the pilot plasma to extend somewhat into the better cooled regions remote from the center, it also equalizes the lateral surface doping distribution, thereby homogenizing the carrier lifetime gettering of the device.

The design according to the present disclosure may lead to the following main advantages of a large area thyristor made according to the present disclosure:

(i) With the exception of the corners, the turn-on line of the main thyristor may be equally shorted all around, leading to a homogeneous turn-on along the whole turn-on line and precluding any preferential or hampered places at turn-on.

(ii) A minimum of main thyristor area may be lost for a given beam configuration and turn-on line length.

(iii) The pilot is somewhat protected against overload due to the possible plasma spreading into the beams at peak pilot current.

(iv) During processing, the high surface doping may be more evenly distributed across the wafer, leading to lower tension and more homogeneous gettering action.

(v) The inevitable matching zones of the shorting may be moved to places irrelevant for plasma spread and therefore can be clearly over-shorted, eliminating the risk of "high-$t_q$-spots".

In accordance with an exemplary embodiment, the conductivity types of all layers are switched, for example, the base layer 110 and cathode emitter layer 106 are p type, and the base layer 108 and anode layer 112 are n type.

It should be noted that the term "comprising" or "including" does not exclude other elements or steps and that the indefinite article "a" or "an" does not exclude the plural. Also, elements described in association with different embodiments may be combined.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

List of Reference Signs
100 Phase controlled thyristor
102 Cathode side
104 Anode side
106 n⁺ cathode emitter layer
108 p base layer
110 n base layer
112 p anode layer
114 Cathode metallization
116 Anode metallization
118 Gate metallization
120 Auxiliary thyristor
122 further n⁺ cathode emitter of auxiliary thyristor
124 further Cathode metallization of auxiliary thyristor
126 Main thyristor
128 Shorts dots
130 Gate of auxiliary thyristor
200 Mask for n-region definition
202 Bulk shorts pattern
204 Shorts dots
206 Distributed Gate structure
208 additional shorts dots
210 region close to gate structure
300 Mask for n-region definition
306 Gate structure
308 additional shorts
310 region close to main gate beam
312 region close to middle line
314 Middle line
316 Main gate beam
318 pilot gate structure
320 pilot emitter extension into main distributed gate beams

What is claimed is:

1. A phase control thyristor comprising:
a main gate structure on a cathode side of the thyristor;
a plurality of local emitter shorts dots arranged in a shorts pattern on the cathode side of the thyristor, wherein:
the main gate structure includes longitudinal main gate beams extending from a center region of a surface of the cathode side towards a circumferential region;
neighboring main gate beams are arranged with a distance with respect to an associated intermediate middle line;
the shorts pattern is more homogeneous in a region closer to a corresponding one of the main gate beams than in a region closer to the associated middle line; and
the density of the emitter shorts dots is smaller in the region closer to the corresponding one of the main gate beams and larger in the region closer to the associated middle line.

2. The phase control thyristor according to claim 1, wherein the emitter short dots have a diameter between 30 to 500 μm.

3. The phase control thyristor according to claim 1, wherein the emitter short dots have a surface area of 2.5% up to 8% of the total area in the region closer to a main gate beam.

4. The phase control thyristor according to claim 1, wherein the emitter short dots have a surface area of 8% up to 20% of the total area in the region closer to an associated middle line.

5. The phase control thyristor according to claim 1, wherein a number of dots is between 12 to 10000/cm² in the region closer to a main gate beam.

6. The phase control thyristor according to claim 1, wherein a number of dots is between 40 to 30000/cm² in the region closer to the associated middle line.

7. The phase control thyristor according to claim 1, wherein the shorts dots in the region closer to a main gate beam have substantially the same spacings.

8. The phase control thyristor according to claim 1, wherein the shorts dots in the region closer to a main gate beam have substantially the same sizes.

9. The phase control thyristor according to claim 1, wherein the shorts dots in the region closer to a main gate beam have at least one of larger spacings and smaller sizes than the shorts dots in the region closer to the associated middle line.

10. The phase control thyristor according to claim 1, wherein neighboring main gate beams are arranged symmetrically with respect to the associated intermediate middle line.

11. The phase control thyristor according to claim 1, wherein the main gate beams are tapered with a beam width reducing from the center region towards the circumferential region.

12. The phase control thyristor according to claim 11, wherein the local width of the main gate beams is adapted to a local current density during regular thyristor operation.

13. The phase control thyristor according to claim 11, wherein the beam width continuously reduces from the center region towards the circumferential region.

14. The phase control thyristor according to claim 1, comprising:
a pilot thyristor on the cathode side, the pilot thyristor including a pilot gate structure comprising longitudinal pilot gate beams extending into a region of the main gate beams.

15. The phase control thyristor according to claim 2, wherein the emitter short dots have a diameter between 50 and 400 µm.

16. The phase control thyristor according to claim 2, wherein the emitter short dots have a diameter between 100 and 400 µm.

17. The phase control thyristor according to claim 4, wherein the emitter short dots have a surface area of 10% up to 20% of the total area in the region closer to the associated middle line.

18. The phase control thyristor according to claim 5, wherein the number of dots is between 100 to 3500/cm² in the region closer to the main gate beam.

19. The phase control thyristor according to claim 6, wherein the number of dots is at least 200/cm² to 30000/cm² in the region closer to the associated middle line.

20. The phase control thyristor according to claim 2, wherein the emitter short dots have a surface area of 2.5% up to 8% of the total area in the region closer to a main gate beam.

21. The phase control thyristor according to claim 2, wherein the emitter short dots have a surface area of 8% up to 20% of the total area in the region closer to an associated middle line.

22. The phase control thyristor according to claim 3, wherein a number of dots is between 12 to 10000/cm² in the region closer to a main gate beam.

23. The phase control thyristor according to claim 4, wherein a number of dots is between 40 to 30000/cm² in the region closer to the associated middle line.

* * * * *